(12) United States Patent
Lancaster

(10) Patent No.: US 8,386,198 B2
(45) Date of Patent: Feb. 26, 2013

(54) REAL-TIME POWER LINE RATING

(75) Inventor: Mark Lancaster, Brooks, GA (US)

(73) Assignee: Southwire Company, Carrollton, GA (US)

( * ) Notice: Subject to any disclaimer, the term of this patent is extended or adjusted under 35 U.S.C. 154(b) by 631 days.

(21) Appl. No.: 12/612,728

(22) Filed: Nov. 5, 2009

(65) Prior Publication Data

US 2010/0114392 A1   May 6, 2010

Related U.S. Application Data

(60) Provisional application No. 61/111,814, filed on Nov. 6, 2008.

(51) Int. Cl.
*G01R 21/00* (2006.01)

(52) U.S. Cl. .................................................... 702/60

(58) Field of Classification Search .............. 702/58, 702/60, 64, 65, 81, 90, 91, 130, 136, 182–185, 702/188, 193; 324/127
See application file for complete search history.

(56) References Cited

U.S. PATENT DOCUMENTS

| | | | |
|---|---|---|---|
| 4,420,752 A | 12/1983 | Davis et al. | |
| 4,689,752 A | 8/1987 | Fernandes et al. | |
| 4,728,887 A * | 3/1988 | Davis ........................ | 324/127 |
| 4,777,381 A | 10/1988 | Fernandes | |
| 4,794,327 A | 12/1988 | Fernandes | |
| 4,796,027 A | 1/1989 | Smith-Vaniz | |
| 4,806,855 A | 2/1989 | Davis | |
| 4,829,298 A | 5/1989 | Fernandes | |
| 4,894,785 A | 1/1990 | Fernandes | |
| 4,904,996 A | 2/1990 | Fernandes | |
| 5,029,101 A | 7/1991 | Fernandes | |
| 5,140,257 A | 8/1992 | Davis | |
| 5,235,681 A | 8/1993 | Masuzaki et al. | |
| 5,235,861 A | 8/1993 | Seppa | |
| 5,341,088 A | 8/1994 | Davis | |

(Continued)

FOREIGN PATENT DOCUMENTS

| | | |
|---|---|---|
| EP | 1 385 013 A1 | 1/2004 |
| EP | 1 703 428 A2 | 9/2006 |

(Continued)

OTHER PUBLICATIONS

Transmission & Distribution World, "Oncor Seeks Stimulus Funds for Real-Time Dynamic Transmission Line Rating Technology Study," Aug. 27, 2009, Business Wire, 2 pgs., http://www.tdworld.com/test_monitor_control/highlights/oncor-transmission-line-rating-funds-0809/index.html.

(Continued)

*Primary Examiner* — Mohamed Charioui
(74) *Attorney, Agent, or Firm* — Merchant & Gould

(57) ABSTRACT

Real-time power line rating may be provided. First, sensor data may be received corresponding to a conductor of a power line. The sensor data may provide real-time weather conditions for the conductor's environment. The sensor data may be received from a sensor device configured to collect the sensor data. The sensor data may correspond to the weather conditions at a location of the sensor device on the power line. Next, design limitations for the power line having the conductor may be received. The conductor of the power line may have a design ampacity based upon the design limitations and assumed weather conditions for the conductor's environment. Then a dynamic ampacity may be calculated for the power line based upon the received sensor data and the received design limitations for the power line. The power line may then be operated according to the calculated dynamic ampacity instead of the design ampacity.

20 Claims, 4 Drawing Sheets

U.S. PATENT DOCUMENTS

| | | | |
|---|---|---|---|
| 5,397,983 | A | 3/1995 | Zabar et al. |
| 5,517,864 | A | 5/1996 | Seppa |
| 5,559,430 | A | 9/1996 | Seppa |
| 5,892,430 | A | 4/1999 | Wiesman et al. |
| 5,918,288 | A | 6/1999 | Seppa |
| 5,933,355 | A * | 8/1999 | Deb ............................... 702/60 |
| 6,097,298 | A | 8/2000 | Brown |
| 6,205,867 | B1 | 3/2001 | Hayes et al. |
| 6,229,451 | B1 | 5/2001 | Brown |
| 6,523,424 | B1 | 2/2003 | Hayes et al. |
| 6,727,604 | B2 | 4/2004 | Couture |
| 6,776,572 | B2 | 8/2004 | Reist |
| 6,799,080 | B1 | 9/2004 | Hylden et al. |
| 6,873,746 | B2 | 3/2005 | Stewart et al. |
| 7,006,524 | B2 | 2/2006 | Freeman et al. |
| 7,103,511 | B2 | 9/2006 | Petite |
| 7,136,725 | B1 | 11/2006 | Paciorek et al. |
| 7,282,944 | B2 | 10/2007 | Gunn et al. |
| 7,310,948 | B2 | 12/2007 | Shirmohamadi |
| 7,336,202 | B2 | 2/2008 | Kawai et al. |
| 7,369,045 | B2 | 5/2008 | Hansen |
| 7,430,932 | B2 | 10/2008 | Mekhanoshin et al. |
| 7,494,271 | B2 | 2/2009 | Scholtz et al. |
| 7,504,819 | B2 | 3/2009 | Engelhardt |
| 7,575,371 | B1 | 8/2009 | Yakymyshyn et al. |
| 7,620,517 | B2 | 11/2009 | Scholtz et al. |
| 7,641,387 | B2 | 1/2010 | Engelhardt et al. |
| 7,733,094 | B2 | 6/2010 | Bright et al. |
| 7,786,894 | B2 | 8/2010 | Polk et al. |
| 7,845,847 | B2 | 12/2010 | Yakymyshyn et al. |
| 7,845,848 | B2 | 12/2010 | Yakymyshyn et al. |
| 7,902,854 | B2 | 3/2011 | Gunn et al. |
| 7,930,141 | B2 | 4/2011 | Banting |
| 7,987,071 | B1 | 7/2011 | Dorfman et al. |
| 2006/0265175 | A1 | 11/2006 | Shomohamadi |
| 2007/0038396 | A1* | 2/2007 | Zima et al. ....................... 702/65 |
| 2008/0077336 | A1 | 3/2008 | Fernandes |
| 2009/0015239 | A1 | 1/2009 | Georgiou et al. |
| 2009/0115426 | A1 | 5/2009 | Muench, Jr. et al. |
| 2009/0243876 | A1 | 10/2009 | Lilien et al. |
| 2009/0284249 | A1 | 11/2009 | Syracuse et al. |
| 2010/0017153 | A1 | 1/2010 | Strehl |
| 2010/0033345 | A1 | 2/2010 | Polk et al. |
| 2010/0085036 | A1 | 4/2010 | Banting et al. |
| 2011/0196536 | A1 | 8/2011 | Phillips et al. |
| 2011/0218790 | A1 | 9/2011 | Algaonkar et al. |
| 2011/0238374 | A1 | 9/2011 | Lancaster |
| 2012/0278011 | A1 | 11/2012 | Lancaster ....................... 702/57 |

FOREIGN PATENT DOCUMENTS

| | | | |
|---|---|---|---|
| WO | WO 2011/100404 | A1 | 8/2001 |
| WO | WO 2004/038891 | A2 | 5/2004 |
| WO | WO 2007/031435 | A1 | 3/2007 |
| WO | WO 2007/134022 | A2 | 11/2007 |
| WO | WO 2007/149668 | A2 | 12/2007 |
| WO | WO 2008/097458 | A1 | 8/2008 |
| WO | WO 2009/058955 | A1 | 5/2009 |
| WO | WO 2010/042442 | A1 | 4/2010 |
| WO | WO 2010/054072 | A1 | 5/2010 |
| WO | WO 2010/127145 | A1 | 11/2010 |

OTHER PUBLICATIONS

RUS Bulletin 1724E-200, Design Manual for High Voltage Transmission Lines, Electric Staff Division, Rural Utilities Service, U.S. Department of Agriculture, Revised May 2005, 314 pgs.
Gary Schmidt et al., "Advances in Fiber Optic Distributed Temperature Sensing for Underground Transmission Cables," presented to the Cable Systems Sub-Committe C of the IEEE PES Insulated Conductors Committee, St. Petersburg, FL, Nov. 1999, 6 pgs.
International Search Report dated Mar. 9, 2010 cited in Application No. PCT/US2009/063390.
Gary Schmidt et al., "Advances in Fiber Optic Distributed Temperature Sensing for Underground Transmission Cables," SPEC SensorTran Division ComEd, Nov. 1999, 7 pgs.
G.P. Van Der Wijk et al., "An Intelligent HV Power Cable System," CIGRE 1996: 15/21/33-11, 6 pgs., *publication unknown*.
Cable Design—particle atricle, pp. 2-10, *author, publication, & date unknown*.
O. Nigol et al., "Characteristics of ACSR Conductors at High Temperatures and Stresses," IEEE Transactions on Power Apparatus and Systems, vol. PAS-100, No. 2, Feb. 1981, pp. 485-493.
"ComEd: Engenerized for the Future," Commonwealth Edison pamphlet, 10 pgs., *date unknown*.
Gene Sanders, "FO Conductor: Temp Sensing," Problem Solving Report Question No. 1058607.002, Jan. 19, 2000, pp. 1-18.
K.T. Yoon, "Controlling and Monitoring Singapore's Underground Grid," PowerGrid Ltd., Singapore, ISSN 0895-0156, Oct. 1999, pp. 23-29.
Todd Hudson, "Fine-tuned for cable TV Introducing an optical power meter ideally suited for analog measurements," Communications Test Equipment, Siemens Industrial Automation, Products, 1 pg., *date unknown*.
"Guide for Partial-Discharge Test Procedure," Publication T-24-380, Revised Dec. 1980, Insulated Cable Engineers Association, Inc., 6 pgs., *author unknown*.
Jay A. Williams et al., "Increasing Cable Rating by Distributed Fiber Optic Temperature Monitoring and Ampacity Analysis," Transmission and Distribution Conference, IEEE vol. 1, Apr. 1999, 7 pgs.
D.A. Douglass, "Radial and Axial Temperature Gradients in Bare Stranded Conductor," IEEE Power Engineering Review, Apr. 1986, PER 6/Issue 4, pp. 1-7.
J.F. Minambres et al., "Radial Temperature Distribution in ACSR Conductors Applying Finite Elements," Power Delivery, IEEE Transactions on vol. 14, Issue 2, Apr. 1999, pp. 473-480.
Stephen D. Foss et al., "Significance of the Conductor Radial Temperature Gradient within a Dynamic Line Rating Methodology," IEEE Power Delivery, vol. 2, Issue 2, 1986, 7 pgs.
Tom Rodenbaugh et al., "Temperature sensors maximize underground cable power transfer," Electric Light & Power, Dec. 1, 1998, Technology, 2 pgs.
Ichiro Matsubara et al., "Total Monitoring System for the Reihoku Thermal Power Transmission Line of the Kyushu Electric Power Company," 7 pgs, *publication & date unknown*.
AEIC CS5-94, Specifications for Cross-Linked Polyethylene Insulated Shielded Power Cables Rated 5 Through 46 Kv, $10^{th}$ Edition, Association of Edison Illuminating Companies, Mar. 1, 1994, author unknown, pp. 24, 25, 33, & 34.
Alfred Roller et al., "Fortified with Fiber Optics," Siemens Telecommunication Cables, Neustadt, Technology, 3 pgs., *date unknown*.
Murray W. Davis, "A New Thermal Rating Approach: The Real Time Thermal Rating System for Strategic Overhead Conductor Tranmission Lines, Part I, General Description and Justification of the Real Time Thermal Rating System," IEEE Transactions on Power Apparatus and Systems, vol. PAS-96, No. 3, May/Jun. 1977, pp. 803-809.
U.S. Office Action dated Jul. 6, 2011 cited in U.S. Appl. No. 12/729,319, 19 pgs.
U.S. Final Office Action dated May 14, 2012 cited in U.S. Appl. No. 12/729,319, 27 pgs.
G.R. Kirikera et al., "Initial evaluation of an active / passive structural neural system for health monitoring of composite materials," Institute of Physics, Smart Materials & Structures, 2006, pp. 1275-1286.
Copending U.S. Appl. No. 13/545,087, filed Jul. 10, 2012 entitled "Power Line Maintenance Monitoring".
U.S. Department of Energy, "Sensing and Measurement," (2007), 26 pgs.
Whapham et al., "Use of factor-formed dead-ends on high temperature conductors," Transmission and distribution conference and exhibition IEEE PES (2006), 5 pgs.
Fierro-Chavez et al, "Online leakage current monitoring of 400 kV insulator strings in polluted areas," IEEE (1996), 5 pgs.
Wang et al., Oak Ridge National Laboratory, ORNL/TM-2008/156, "Integrity of ACSR Full tension single0stage splice connector at higher operation temperature," (2008), 191 pgs.
RUS-Bulleting 1724E-200, "Design manual for high voltage transmission lines," (2009), 322 pgs.

* cited by examiner

REAL-TIME POWER LINE RATING

RELATED APPLICATION

Under provisions of 35 U.S.C. §119(e), Applicant claims the benefit of U.S. provisional application No. 61/111,814, filed Nov. 6, 2008, which is incorporated herein by reference.

COPYRIGHTS

All rights, including copyrights, in the material included herein are vested in and the property of the Applicants. The Applicants retain and reserve all rights in the material included herein, and grant permission to reproduce the material only in connection with reproduction of the granted patent and for no other purpose.

BACKGROUND

Power line operators assume that the ampacity of a power line is a constant value. When calculating power line ampacity, conservative assumptions about weather in the power line's environment are used. In some environmental situations, these conservative assumptions about the weather may result in not using the power line to its fullest safe capacity. For example, the power line's real-time environment may be cloudy and cool, however, conservative assumptions when initially rating the power line may have been for direct sunlight and high temperatures. Thus, the conventional strategy is to make conservative assumptions about weather in the power line's environment and not consider real-time environmental conditions. This often causes problems because the conventional strategy results in underutilizing a power line's capacity in some situations.

SUMMARY

This Summary is provided to introduce a selection of concepts in a simplified form that are further described below in the Detailed Description. This Summary is not intended to identify key features or essential features of the claimed subject matter. Nor is this Summary intended to be used to limit the claimed subject matter's scope.

Real-time power line rating may be provided. First, sensor data may be received corresponding to a conductor of a power line. The sensor data may provide real-time weather conditions for the conductor's environment. The sensor data may be received from a sensor device configured to collect the sensor data. The sensor data may correspond to the weather conditions at a location of the sensor device on the power line. Next, design limitations for the power line having the conductor may be received. The conductor of the power line may have a design ampacity based upon the design limitations and assumed weather conditions for the conductor's environment. Then a dynamic ampacity may be calculated for the power line based upon the received sensor data and the received design limitations for the power line. The power line may then be operated according to the calculated dynamic ampacity instead of the design ampacity.

Both the foregoing general description and the following detailed description provide examples and are explanatory only. Accordingly, the foregoing general description and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present invention. In the drawings.

DETAILED DESCRIPTION

Figure 1:
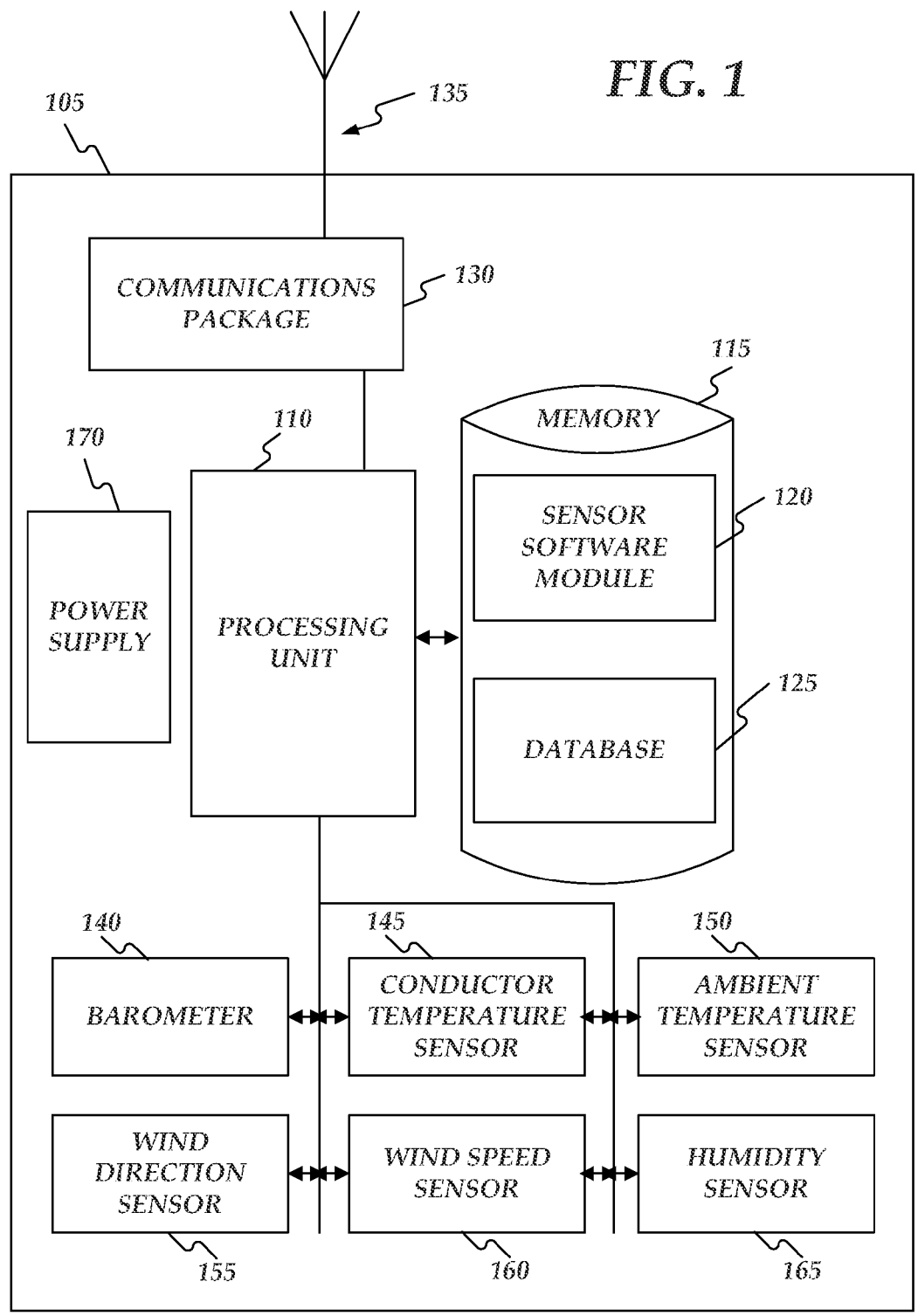
FIG. 1 shows a sensor device.

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention.

Electric utilities, when evaluating conductor capacity (ampacity), assume variables required for capacity calculation are constant, which results in a constant (static) rating for a power line (e.g. transmission line, distribution line, etc.). There are many variables used in the ampacity calculation, including ambient temperature, wind speed, solar radiation, and maximum conductor temperature. Weather conditions corresponding to these aforementioned assumptions, however, are not constant, thus creating the problem of attempting to model a dynamic system with a static model. Consequently, during less favorable weather conditions, for example, when: i) ambient temperature is higher than an assumed value; or ii) when the wind speed is lower than an assumed value, operating the power line at the calculated ampacity may result in the power line exceeding its temperature rating. This may damage to the power line's conductor or may result in a clearances violation causing an unanticipated line outage.

Consistent with embodiments of the invention, adapting power line ratings to actual weather conditions may prevent damage, unanticipated outages, or allow for an increase in conductor ampacity. Accordingly, a dynamic line rating system may provide protection for the power line from overheating, or may provide an increase in capacity during a critical power demand period by providing real-time data to calculate the conductor's actual ampacity.

FIG. 1 shows a sensor device 105. Sensor device 105 may include a processing unit 110 and a memory 115. Memory 115 may include a sensor software module 120 and a database 125. While executing on processing unit 110, sensor software module 120 may perform processes for collecting and transmitting real-time sensor data.

Sensor device 105 may also include a communications package 130 that may include and antenna 135 and may be connected to processing unit 110. Communications package 130 may transmit real-time sensor data collected from sensor device 105 and may receive other data including control data. Communications package 130 may communicate over a network (not shown.) The network may comprise, for example, a local area network (LAN) or a wide area network (WAN). When a LAN is used as the network, a network interface located at sensor device 105 may be used to interconnect any other processor on the network. When the network is implemented in a WAN networking environment, such as the Internet, sensor device 105 may include an internal or external modem (not shown) or other means for establishing communications over the WAN. Further, in utilizing the network, data sent over the network may be encrypted to insure data security by using encryption/decryption techniques.

In addition to utilizing a wire line communications system, a wireless communications system, or a combination of wire line and wireless may be utilized as the network. Wireless may be defined as radio transmission via the airwaves. However, it may be appreciated that various other communication techniques can be used to provide wireless transmission, including infrared line of sight, cellular, microwave, satellite, packet radio, and spread spectrum radio. For example, sensor device 105 may communicate across a wireless interface such as, for example, a cellular interface (e.g., general packet radio system (GPRS), enhanced data rates for global evolution (EDGE), global system for mobile communications (GSM)), a wireless local area network interface (e.g., WLAN, IEEE 802), a bluetooth interface, WiFi, WiMax, another RF communication interface, and/or an optical interface. Furthermore, sensor device 105 may communicate over a power line carrier system.

Sensor device 105 may include sensor transducers. The sensor transducers may include, but are not limited to, a barometer 140, a conductor temperature sensor 145, an ambient temperature sensor 150, a wind direction sensor 155, a wind speed sensor 160, and a humidity sensor 165, all of which may collect and communicate sensor data to processing unit 110. Barometer 140 may collect sensor data comprising barometric pressure readings at a location where sensor device 105 is located. Ambient temperature sensor 150 may collect sensor data comprising ambient temperature readings at the location where sensor device 105 is located. Wind direction sensor 155 may collect sensor data comprising wind direction readings at the location where sensor device 105 is located. Wind speed sensor 160 may collect sensor data comprising wind speed readings at the location where sensor device 105 is located. Humidity sensor 165 may collect sensor data comprising humidity readings at the location where sensor device 105 is located.

Because sensor device 105 may be in close proximity to a power line (e.g. coupled to the power line,) conductor temperature sensor 145 may comprise a thermal couple coupled to the power line. Conductor temperature sensor 145 may collect sensor data comprising the temperature of a conductor comprising the power line.

All elements within sensor device 105 may be supplied with power from a power supply 170. Again, because sensor device 105 may be in close proximity to the power line (e.g. coupled to the power line,) power supply 170 may scavenge power from the power line using a current transformer (CT,) for example.

Figure 2:
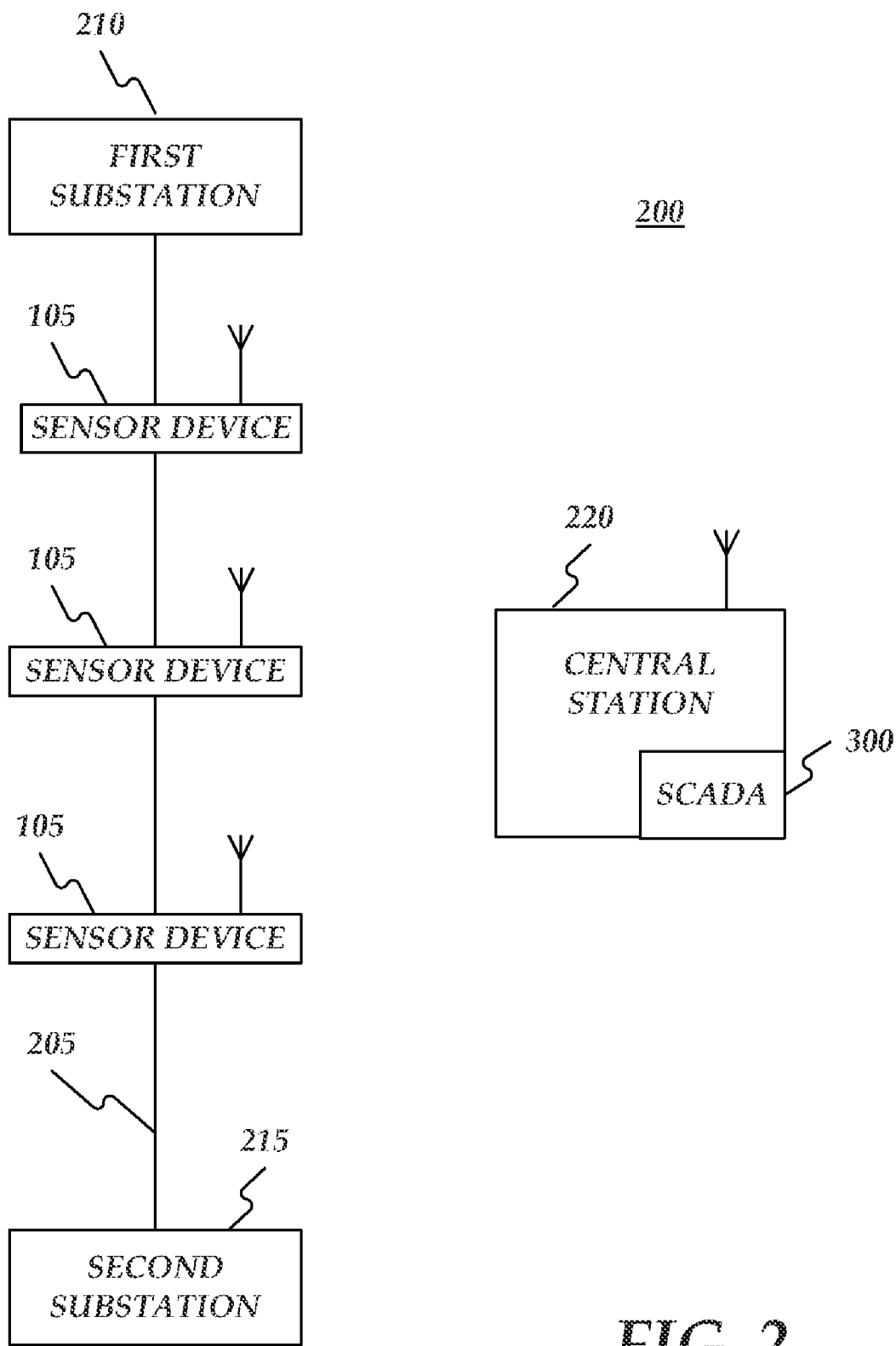
FIG. 2 shows an operating environment for the sensor device.

FIG. 2 shows an operating environment 200 for sensor device 105 consistent with embodiments of the invention. As shown in FIG. 2, a power line 205 may connect a first substation 210 and a second substation 215. Power line 205 may be tens or even hundreds of miles long and may pass through many different weather zones. RUS BULLETIN 1724E-200, "DESIGN MANUAL FOR HIGH VOLTAGE TRANSMISSION LINES", published by the Electric Staff Division, Rural Utilities Service, U.S. Department of Agriculture shows how power lines may be designed and is incorporated herein by reference.

Any number of sensor devices 105 may be placed on power line 205. Sensor devices 105 in environment 200 may include any one or more of a combination of the sensor transducers shown in FIG. 1. Each of the sensor devices 105 may collect sensor data at a location where the sensor device is located on power line 105. After collection, each of the sensor devices 105 may transmit its collected sensor data to a central station 220. At central station 220, the received sensor data may be fed into a real-time rating software and/or supervisory control and data acquisition (SCADA) system 300 as shown in FIG. 3.

Figure 3:
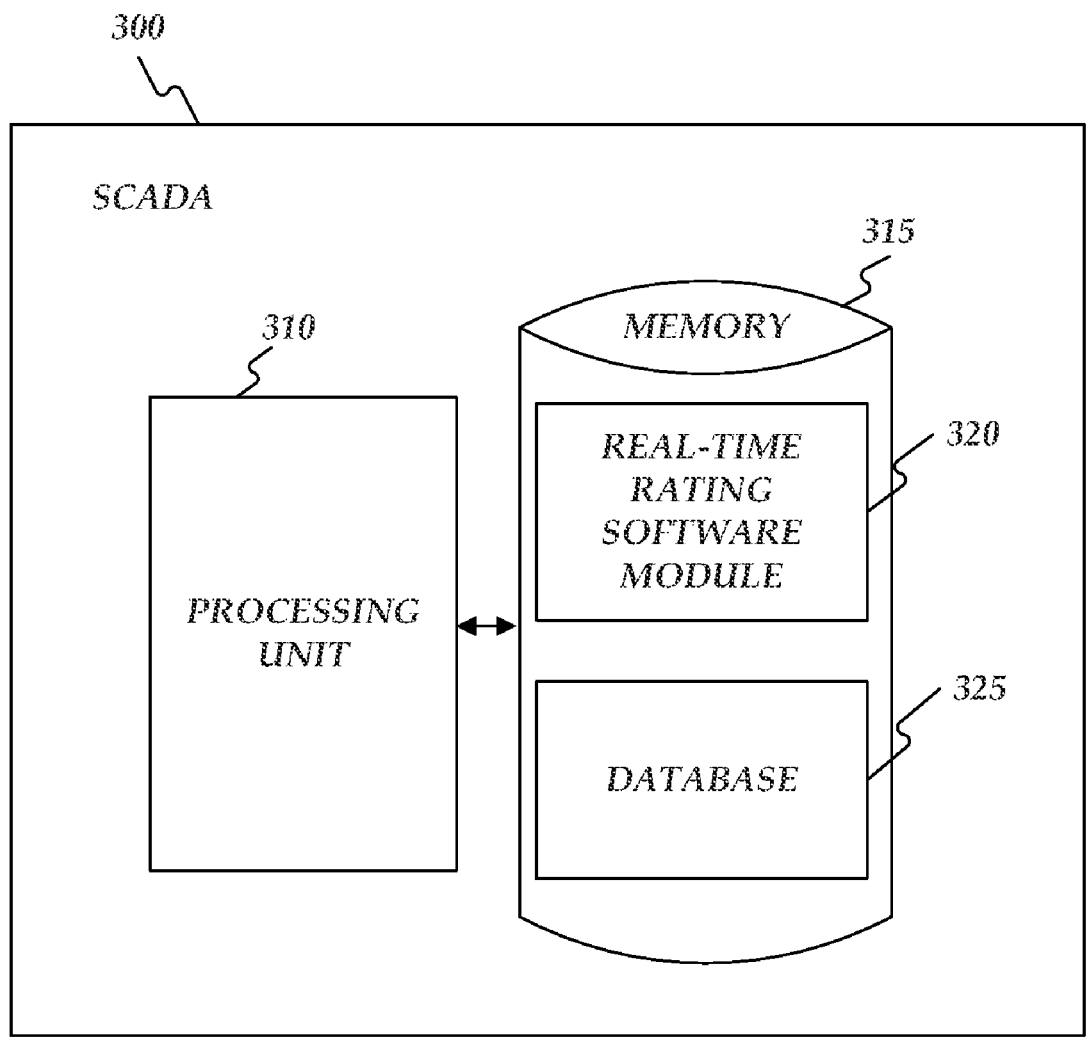
FIG. 3 shows a SCADA system.

FIG. 3 shows real-time rating software and/or supervisory control and data acquisition (SCADA) system 300 in more detail. SCADA system 300 may include a processing unit 310 and a memory 315. Memory 315 may include a real-time rating software module 320 and a database 325. While executing on processing unit 310, sensor software module 320 may perform, for example, processes for providing a real-time power line rating as described in greater detail below with respect to FIG. 4.

Consistent with embodiments of the invention, SCADA system 300 may adapt power line 205's ampacity rating to actual conditions experienced by power line 205 to increase power line 205's conductor ampacity. In other words, SCADA system 300 may provide a dynamic line rating for power line 205 in order to provide an increase in power line ampacity by considering a given conductor's heat-storage capacity in power line 205. For example, if according to the sensor data the conductor's temperature is already at 98 degrees Fahrenheit with a low current load, SCADA system 300 may de-rate the conductor and suggest not loading it to its assumed full capacity. Moreover, if the conductor temperature according to the sensor data in at 15 degrees Fahrenheit with a high current load, SCADA system 300 may up-rate the conductor and suggest loading it above its assumed full capacity.

In addition, other data within the sensor data may be used by SCADA system 300 to accurately predict a rate of change in the conductor's temperature. With an accurately predicted rate of temperature change, SCADA system 300 can help power system operators, for example, to plan on how to load power line 205 latter in the day and take into consideration predicted dynamic line ratings for power line 205. For example, the sensor data may be used to predict weather along power line 205 and thus predict a real-time rating for power line 205 hours or even days into the future.

Figure 4:
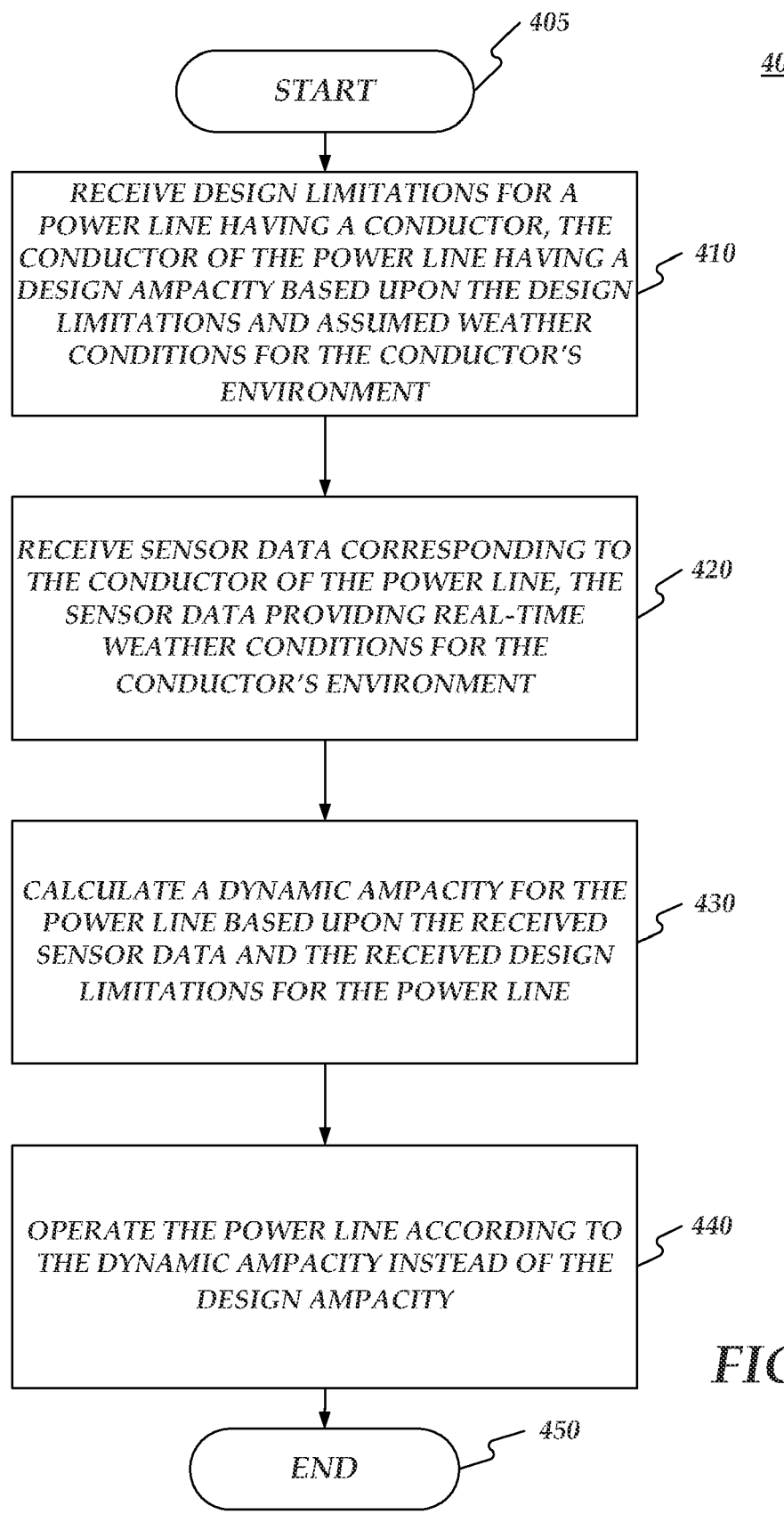
FIG. 4 is a flow chart of a method for providing a real-time power line rating.

FIG. 4 is a flow chart setting forth the general stages involved in a method 400 consistent with embodiments of the invention for providing a real-time power line rating. Method 400 may be implemented using SCADA system 300 as described in more detail above with respect to FIG. 3. Ways to implement the stages of method 400 will be described in greater detail below.

Method 400 may begin at starting block 405 and proceed to stage 410 where SCADA system 300 may receive design limitations for power line 205 having a conductor. The conductor of power line 205 may have a design ampacity based upon the design limitations and assumed weather conditions for the conductor's environment. For example, a power line operator (e.g. an electric utility company) may build power line 205. Power line 205 may be built to certain design limitations under assumed weather conditions. For example, power line 205 may be built to have a maximum amount of sag in certain worst case scenarios. Such worst case scenarios may comprise the "hot curve" (i.e. maximum sag) condition. For example, the hot curve condition may comprise, but is not limited to, maximum conductor operating temperature (e.g. 212 degrees Fahrenheit), no ice, no wind, and final sag curve. The hot curve may be used to check for minimum vertical clearances for power line 205. In this case, power line 205 may have the design ampacity based upon these design limitations and assumed weather conditions for the conductor's environment. Making these worst case scenarios helps the designer of power line 205 make sure that power line 205 is placed on tall enough structures and does not sag down too much and violate minimum vertical clearances for power line 205 set out by applicable safety codes (e.g. the National Electric Safety Code (NESC).) In reality, however, such worst case scenarios rarely exist.

From stage 410, where SCADA system 300 receives the design limitations for power line 205, method 400 may advance to stage 420 where SCADA system 300 may receive sensor data corresponding to the conductor of power line 205. The sensor data may provide real-time weather conditions for the conductor's environment. For example, as shown in FIG. 2, any number of sensor devices 105 may be placed on power line 205. Sensor devices 105 in environment 200 may include any one or more of a combination of the sensor transducers shown in FIG. 1. Each of the sensor devices 105 may collect sensor data at a location where the sensor device is located on power line 105. After collection, each of the sensor devices 105 may transmit its collected sensor data to a central station 220 where it is received by SCADA system 300.

The received sensor data may comprise, but is not limited to: i) ambient temperature of the environment around the conductor at a point along power line 205 where a corresponding sensor device happens to be; ii) wind speed around the conductor at a point along power line 205 where the corresponding sensor device happens to be; iii) a solar radiation level (e.g. amount of cloudiness) at the conductor at a point along power line 205 where a corresponding sensor device happens to be; or iv) a temperature of the conductor itself at a point along power line 205 where a corresponding sensor device happens to be. The sensor data may also include barometric pressure readings, wind direction, and humidity at the conductor at a point along power line 205 where a corresponding sensor device happens to be. The aforementioned are examples and the sensor data may comprise any data helpful for calculating real-time conductor ratings.

Once SCADA system 300 receives the sensor data in stage 420, method 400 may continue to stage 430 where SCADA system 300 may calculate a dynamic ampacity for power line 205 based upon the received sensor data and the received design limitations for power line 205. For example, if the sensor data is received at multiple points along power line 205, like readings may be averaged. For example, conductor temperature at several points along power line may be averaged to provide an average conductor temperature. Or the reading that would produce the most conservative dynamically calculated ampacity for power line 205 may be used. For example, the highest conductor temperature at one of the several points along power line may be used.

Regardless of the process, sensor data used, or calculations used, an objective of calculating the dynamic (e.g. real-time) ampacity for power line 205 may be to calculate a more accurate ampacity for power line 205 not based on assumed or worst case environmental conditions, but rather on actual conditions for power line 205's conductors. Notwithstanding, the calculated dynamic ampacity for power line 205 should not cause power line 205's conductors to sag down too much and violate minimum vertical clearances for power line 205 set out by applicable safety codes. Also, the calculated dynamic ampacity for power line 205 should not cause power line 205's conductors to become "annealed" or damaged in anyway.

In other words, the objective of calculating the dynamic ampacity for power line 205 is to consider the heat-storage capacity of the conductor. If the conductor gets too hot, minimum vertical clearances may be violated or the conductor may be damaged. At least two conditions contribute to the conductor's temperature, the amount of current running through the conductor and the environmental conditions. If the environmental conditions are favorable and contribute less heat to the conductor than assumed environmental conditions, then heat caused by current running through the conductor may be increased. Thus with these favorable environmental conditions, more current may be allowed to run through the conductor than can be allowed under the assumed environmental conditions while still maintaining minimum vertical clearances and not damaging the conductor. Consequently, by knowing the real-time environmental conditions, the ampacity of the conductor may be calculated dynamically thus increasing the current carried by power line 205 resulting in increasing the power delivered by power line 205.

After SCADA system 300 calculates the dynamic ampacity for power line 205 in stage 430, method 400 may proceed to stage 440 where SCADA system 300 may operate power line 205 according to the dynamic ampacity instead of the design ampacity. The design ampacity may be based on environmental assumptions when power line 205 is designed. For example, by operating power line 205 according to the dynamic ampacity instead of the design ampacity, more power may be delivered between first substation 210 and second substation 215 without the expense of upgrading the size of power line 205's conductors. Once SCADA system 300 operates power line 205 according to the dynamic ampacity in stage 440, method 400 may then end at stage 450.

Embodiment of the present invention may, for example, be implemented using a memory, a processing unit, and other components. Any suitable combination of hardware, software, and/or firmware may be used to implement the memory, processing unit, or other components. The processing unit may implement program modules. Generally, consistent with embodiments of the invention, program modules may include routines, programs, components, data structures, and other types of structures that perform particular tasks or implement particular abstract data types.

Moreover, embodiments of the invention may be practiced with other computer system configurations, including handheld devices, multiprocessor systems, microprocessor-based or programmable consumer electronics, minicomputers, mainframe computers, and the like. Embodiments of the invention may also be practiced in distributed computing environments where tasks are performed by remote processing devices that are linked through a communications network. In a distributed computing environment, program modules may be located in both local and remote memory storage devices.

Furthermore, embodiments of the invention may be practiced in an electrical circuit comprising discrete electronic elements, packaged or integrated electronic chips containing logic gates, a circuit utilizing a microprocessor, or on a single chip containing electronic elements or microprocessors. Embodiments of the invention may also be practiced using other technologies capable of performing logical operations such as, for example, AND, OR, and NOT, including but not limited to mechanical, optical, fluidic, and quantum technologies. In addition, embodiments of the invention may be practiced within a general purpose computer or in any other circuits or systems.

Embodiments of the invention, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present invention may be embodied in hardware and/or in software (including firmware, resident software, micro-code, etc.). In other words, embodiments of the present invention may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present invention are described above with reference to block diagrams and/or operational illustrations of methods, systems, and computer program products according to embodiments of the invention. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

While certain features and embodiments of the invention have been described, other embodiments of the invention may exist. Furthermore, although embodiments of the present invention have been described as being associated with data stored in memory and other storage mediums, aspects can also be stored on or read from other types of computer-readable media, such as secondary storage devices, like hard disks, floppy disks, or a CD-ROM, a carrier wave from the Internet, or other forms of RAM or ROM. Further, the steps of the disclosed methods may be modified in any manner, including by reordering stages and/or inserting or deleting stages, without departing from the principles of the invention.

While certain embodiments of the invention have been described, other embodiments may exist. While the specification includes examples, the invention's scope is indicated by the following claims. Furthermore, while the specification has been described in language specific to structural features and/or methodological acts, the claims are not limited to the features or acts described above. Rather, the specific features and acts described above are disclosed as example for embodiments of the invention.

What is claimed is:

1. A system for providing a real-time power line rating, the system comprising:
    a sensor device configured to collect sensor data, the sensor data corresponding to a conductor of a power line and corresponding to weather conditions at a location of the sensor device on the power line, an amount of current flowing through the power line, and a real-time temperature of the power line; and
    a supervisory control and data acquisition (SCADA) system configured to;
        receive the sensor data from the sensor device,
        calculate a dynamic ampacity for the power line based on a heat-storage capacity of the conductor, the real-time temperature of the power line, and the weather conditions, wherein calculating the dynamic ampacity comprises calculating a real time current carrying capacity of the power line and predicting a rate of change of temperature of the power line as a function of the amount of current flowing through the power line and the weather conditions along the power line, and
        dynamically alter the amount of current flowing through the power line based on the calculated dynamic ampacity.

2. The system of claim 1, wherein the supervisory control and data acquisition (SCADA) system being configured to calculate the dynamic ampacity comprises the supervisory control and data acquisition (SCADA) system being configured to calculate the dynamic ampacity having a value not to cause the maximum sag for which the conductor of the power line was designed to be exceeded.

3. The system of claim 1, wherein the supervisory control and data acquisition (SCADA) system being configured to calculate the dynamic ampacity comprises the supervisory control and data acquisition (SCADA) system being configured to calculate the dynamic ampacity having a value not to cause damage to the conductor.

4. The system of claim 1, wherein the supervisory control and data acquisition (SCADA) system is further configured to allow operation of the power line up to the calculated dynamic ampacity.

5. The system of claim 1, wherein the sensor device receives its power to operate from the power line.

6. The system of claim 1, wherein the sensor device scavenge power to operate from the power line by using a current transformer (CT).

7. The system of claim 1, wherein the sensor device being configured to collect sensor data comprises the sensor device being configured to collect sensor data comprising ambient temperature of an environment around the conductor at the location.

8. The system of claim 1, wherein the sensor device being configured to collect sensor data comprises the sensor device being configured to collect sensor data comprising temperature of the conductor at the location.

9. A method of providing a real-time power line rating, the method comprising:
    receiving design limitations for a power line having a conductor, the conductor of the power line having a design ampacity based upon the design limitations and assumed weather conditions for the conductor's environment;

receiving sensor data corresponding to the conductor of the power line, the sensor data providing real-time weather conditions for the conductor's environment, an amount of current flowing through the power line, and a real-time temperature of the power line;

calculating a dynamic ampacity for the power line based upon a heat-storage capacity of the conductor, the real time temperature of the power line, and the weather conditions along the power line, wherein calculating the dynamic ampacity comprises calculating a real time current carrying capacity of the power line and predicting a rate of change of temperature of the power line as a function of the amount of current flowing through the power line and the weather conditions along the power line; and operating the power line according to the dynamic ampacity instead of the design ampacity.

10. The method of claim 9, wherein receiving the sensor data comprises receiving the sensor data comprising an ambient temperature of an environment around the conductor at a point along the power line.

11. The method of claim 9, wherein receiving the sensor data comprises receiving the sensor data comprising a wind speed around the conductor at a point along the power line.

12. The method of claim 9, wherein receiving the sensor data comprises receiving the sensor data comprising a solar radiation level at the conductor at a point along the power line.

13. The method of claim 9, wherein receiving the sensor data comprises receiving sensor data comprising a temperature of the conductor at a point along the power line.

14. The method of claim 9, wherein receiving the sensor data comprises receiving the sensor data comprising the sensor data taken at a plurality of points along the power line.

15. The method of claim 9, wherein receiving the design limitations comprises receiving data indicating the maximum sag the conductor of the power line was designed to have.

16. The method of claim 9, wherein calculating the dynamic ampacity comprises calculating the dynamic ampacity having a value not to cause the maximum sag for which the conductor of the power line was designed to be exceeded.

17. The method of claim 9, wherein calculating the dynamic ampacity comprises calculating the dynamic ampacity having a value not to cause damage to the conductor.

18. The method of claim 9, wherein operating the power line according to the dynamic ampacity instead of the design ampacity comprises causing the power line to operate between the calculated dynamic ampacity and the design ampacity when the calculated dynamic ampacity is greater than the design ampacity.

19. The method of claim 9, wherein operating the power line according to the dynamic ampacity instead of the design ampacity comprises causing the power line to operate at less than the calculated dynamic ampacity when the calculated dynamic ampacity is less than the design ampacity.

20. A non-transitory computer-readable medium that stores a set of instructions which when executed perform a method for providing a real-time power line rating, the method executed by the set of instructions comprising:

receiving design limitations for a power line having a conductor, the conductor of the power line having a design ampacity based upon the design limitations and assumed weather conditions for the conductor's environment wherein receiving design limitations comprises receiving data indicating the maximum sag the conductor of the power line was designed to have;

receiving sensor data from a sensor device configured to collect the sensor data, the sensor data corresponding to the conductor of the power line, the sensor data providing real-time weather conditions for the conductor's environment wherein receiving the sensor data comprises receiving the sensor data comprising the sensor data taken at a plurality of points along the power line wherein receiving sensor data comprises receiving at least one of the following: sensor data comprising ambient temperature of environment around the conductor at a point along the power line, receiving sensor data comprises receiving sensor data comprising wind speed around the conductor at a point along the power line, sensor data comprising solar radiation at the conductor at a point along the power line, and sensor data comprising temperature of the conductor at a point along the power line;

calculating a dynamic ampacity for the power line based upon the received sensor data, the real time temperature of the power line, the weather conditions, and the received design limitations for the power line wherein calculating the dynamic ampacity comprises calculating the dynamic ampacity having a value not to cause the maximum sag for which the conductor of the power line was designed to be exceeded and calculating the dynamic ampacity having a value not to cause damage to the conductor, and wherein calculating the dynamic ampacity further comprises calculating a real time current carrying capacity of the power line and predicting a rate of change of temperature of the power line as a function of the amount of current flowing through the power line and the weather conditions along the power line; and operating the power line according to the dynamic ampacity instead of the design ampacity wherein operating the power line according to the dynamic ampacity instead of the design ampacity comprises one of the following: causing the power line to operate between the calculated dynamic ampacity and the design ampacity when the calculated dynamic ampacity is greater than the design ampacity and causing the power line to operate at less than the calculated dynamic ampacity when the dynamic ampacity is less than the design ampacity.

* * * * *